United States Patent [19]
Lauterbach

[11] Patent Number: 5,712,791
[45] Date of Patent: Jan. 27, 1998

[54] METHOD AND APPARATUS FOR DESIGNING A CIRCUIT BY ANALYZING SELECTED ARTIFICIAL HARDWARE DEPENDENCIES INSERTED INTO A DYNAMIC DEPENDENCY GRAPH

[75] Inventor: Gary R. Lauterbach, Los Altos Hills, Calif.

[73] Assignee: Sun Microsystems, Inc., Mountain View, Calif.

[21] Appl. No.: 550,800

[22] Filed: Oct. 31, 1995

[51] Int. Cl.$^6$ ............................................. G06F 17/50
[52] U.S. Cl. ............................................. 364/489
[58] Field of Search .................... 364/488, 489, 364/490, 491

[56] References Cited

U.S. PATENT DOCUMENTS 5,550,749  8/1996  Dey et al. ............................. 364/489
5,555,201  9/1996  Dangelo et al. ...................... 364/489

OTHER PUBLICATIONS

Austin, et al. "Tetra: Evaluation of Serial Program Performance on Fine–Grain Parallel Processors", Computer Science Department, University of Wisconsin, 1993, pp 1–40.
Austin, et al. "Dynamic Dependency Analysis of Ordinary Programs", Proceedings of the 19th Annual International Symposium on Computer Architecture, May, 1992. no page numbers.
Wall, "Limits of Instruction–Level Parallelism", Association for Computing Machinery, 1991, pp. 176–188.
Chandra et al., "Architectural Verification of Processors Using Symbolic Instruction Graphs," 1994 IEEE, pp. 454–459.
Chen et al., "Generating the Optimal Graph Representations from the Instruction Set Tables of Circuits," IEEE 1994 Custom IC Conference, pp. 241–244.
Girkar et al., "Automatic Extraction of Functional Parralism from Ordinary Programs," IEEE Trans. on Parallel & Distributed Systems, vol. 3, No. 2, 1992, pp. 166–178.
Jovanovic, "Software Pipelining of Loops by Pipelining Strongly Connected Components," 1991 Annual Hawai Int'l System Sciences Conference, pp. 351–365.

*Primary Examiner*—Kevin J. Teska
*Assistant Examiner*—Leigh Marie Garbowski
*Attorney, Agent, or Firm*—Flehr Hohbach Test Albritton & Herbert LLP; Williams S. Galliani

[57] ABSTRACT

The disclosed method of designing a circuit includes the step of building a dependency graph for a set of computer program instructions. A set of artificial dependencies are inserted into the dependency graph to form a modified dependency graph. The artificial dependencies are hardware limitations such as register renaming limitations, branch prediction limitations, and memory disambiguation limitations. The execution performance of selected artificial dependencies of the modified dependency graph are then analyzed to generate a set of performance values. The top-ranked performance value is associated with a modified dependency graph with a selected set of hardware dependencies. A circuit specification corresponding to the modified dependency graph with the selected set of hardware dependencies is then used to fabricate a circuit.

18 Claims, 8 Drawing Sheets

| Cycle | Instruction |
|---|---|
| 1 | ① |
| 2 | ② |
| 3 | ③ |
| 4 | ④ |
| 5 | ⑤ |
| 6 | ⑥ |
| 7 | ⑦ |
| 8 | ⑧ |

| Cycle | Instruction | |
|---|---|---|
| 1 | ① | ② |
| 2 | | ③ |
| 3 | | ④ |
| 4 | | ⑤ |
| 5 | | ⑥ |
| 6 | | ⑦ |
| 7 | | ⑧ |
| 8 | | |

Figure 5

| Cycle | Instruction | |
|---|---|---|
| 1 | ① | ② |
| 2 | | ③ |
| 3 | ⑥ | ④ |
| 4 | | ⑤ |
| 5 | | ⑦ |
| 6 | | ⑧ |
| 7 | | |
| 8 | | |

Figure 6

| Cycle | Instruction | |
|---|---|---|
| 1 | ① | ② |
| 2 | | ③ |
| 3 | ⑥ | ④ |
| 4 | ⑤ | ⑦ |
| 5 | | ⑧ |
| 6 | | |
| 7 | | |
| 8 | | |

Figure 7

| Cycle | Instruction | | |
|---|---|---|---|
| 1 | ① ② | | |
| 2 | ③ | | |
| 3 | ⑥ ④ ⑦ | | |
| 4 | ⑤ ⑧ | | |
| 5 | | | |
| 6 | | | |
| 7 | | | |
| 8 | | | |

METHOD AND APPARATUS FOR DESIGNING A CIRCUIT BY ANALYZING SELECTED ARTIFICIAL HARDWARE DEPENDENCIES INSERTED INTO A DYNAMIC DEPENDENCY GRAPH

BRIEF DESCRIPTION OF THE INVENTION

This invention relates generally to the design of microprocessors and other integrated circuits. More particularly, this invention relates to a technique for designing integrated circuits by inserting selected artificial hardware dependencies into dynamic dependency graphs to identify performance results associated with selected circuit configurations.

BACKGROUND OF THE INVENTION

A microprocessor executes a set of instructions specified in a computer program. The manner in which the set of instructions is processed can be described in a graph referred to as a "dynamic dependency graph". In a dynamic dependency graph, the nodes of the graph represent instructions and the edges in the graph represent dependencies between instructions.

Traditionally, dynamic dependency graph have been used to assess the parallelism in a set of instructions. Parallelism is the number of instructions divided by the number of cycles required to execute the instructions.

When a dynamic dependency graph is topologically sorted, its height shows the minimum number of steps required to execute a program. The height of the graph, referred to as the "critical path length", is a function of the dependencies in the graph. Plotting the number of operations by level in the topologically sorted dynamic dependency graph yields a parallelism profile. The average number of operations per level for the parallelism profile is the available parallelism in the application, and can be viewed as the speedup that can be attained by an abstract machine capable of extracting and executing the dynamic dependency graph.

The use of dynamic dependency graphs in parallelism studies is discussed by Austin & Sohi in "Dynamic Dependency Analysis of Ordinary Programs", Proceedings of the 19th Annual International Symposium on Computer Architecture (1992). Austin & Sohi use dynamic dependency graphs to provide a range of parallelism calculations. They analyze parallelism for two types of systems: one system with limited resources and another system with unlimited resources. This approach is taken to provide conservative and optimistic measures of parallelism in a program.

A complete dynamic dependency graph is not required to measure parallelism. Consequently, complete dynamic dependency graphs are not typically utilized in parallelism assessments. Thus, the use of dynamic dependency graphs in the prior art has been of limited scope. This fact is evidenced by the work of Austin & Sohi. While Austin & Sohi move beyond the calculation of a single parallelism value and provide an upper and lower range of parallelism for a program, they do not otherwise incorporate dynamic dependency graphs into a specific circuit design process. Moreover, they do not rely upon the specification of selected hardware dependencies in a dynamic dependency graph to refine a circuit design process.

In view of the foregoing, it would be highly desirable to extend the use of dynamic dependency graphs beyond their role in measuring parallelism. In particular, it would be highly desirable to exploit dynamic dependency graphs in the process of designing a circuit. More specifically, it would be highly desirable to use dynamic dependency graphs with inserted artificial hardware dependencies to select particular resources to be incorporated into a circuit design.

SUMMARY OF THE INVENTION

The invention includes a method of designing a circuit. The first step of the method is to build a dependency graph for a set of computer program instructions. A set of artificial dependencies are then inserted into the dependency graph to form a modified dependency graph. The artificial dependencies are hardware limitations, such as register renaming limitations, branch prediction limitations, and memory disambiguation limitations. The artificial dependencies limit the order in which the program instructions can be executed. The execution performance of selected artificial dependencies of the modified dependency graph are analyzed to generate a set of performance results. The performance results are then ranked. The top-ranked performance result is associated with a modified dependency graph with a selected set of hardware dependencies. A circuit specification corresponding to the modified dependency graph with the selected set of hardware dependencies is then used to fabricate a circuit.

The invention's use of artificial dependencies in a dependency graph results in a number of benefits that can be exploited in a circuit design process. Since each artificial dependency corresponds to a circuit with a distinct set of parameters, the analysis of different artificial dependencies is tantamount to the analysis of different circuit configurations. Thus, different circuit designs can be easily tested by changing artificial dependencies in a dependency graph. Advantageously, the performance of a circuit design can be analyzed by a scheduler, which processes a dependency graph. Consequently, a separate circuit simulator and simulation process is not necessary. Since the dependency graph corresponds to a set of instructions executed by a circuit with specified hardware dependencies, the approach of the invention allows a thorough understanding of the interaction between instructions and the circuit executing the instructions.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
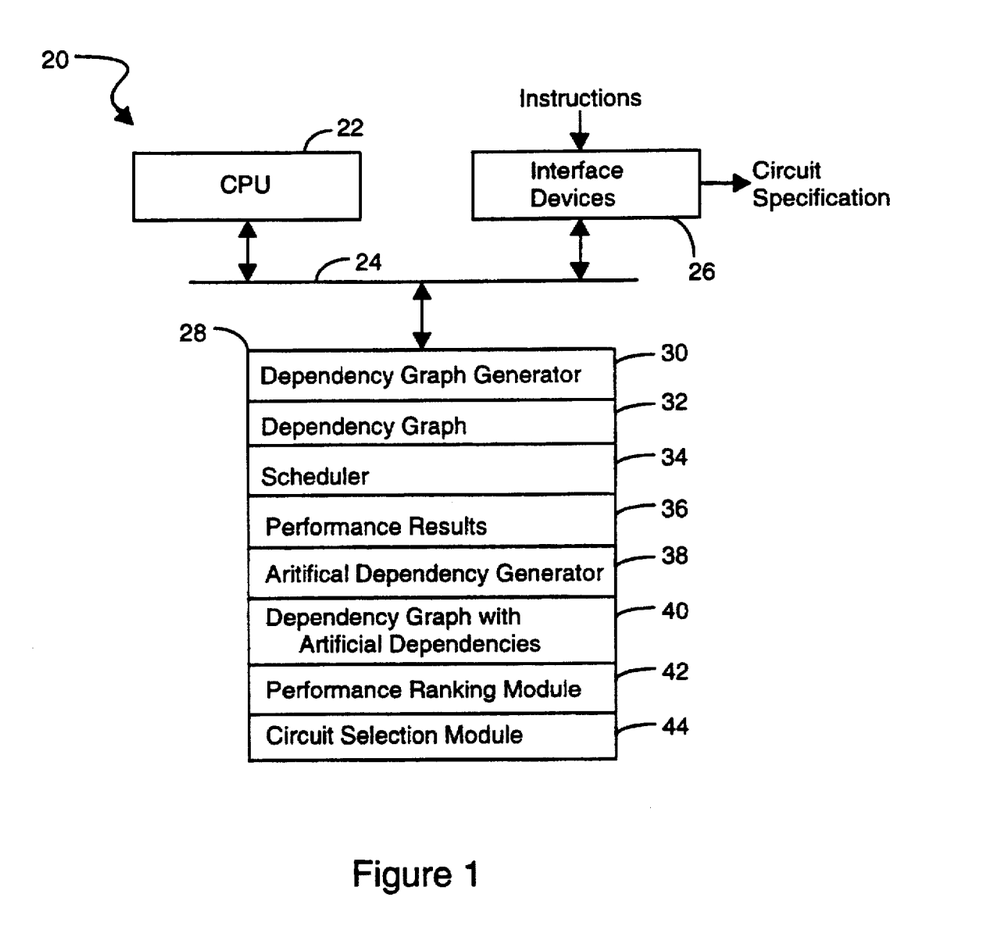
FIG. 1 illustrates an apparatus constructed in accordance with one embodiment of the invention.

FIG. 1 illustrates an apparatus 20 that may be used in accordance with one embodiment of the present invention. The apparatus 20 includes a central processing unit (CPU) 22 that uses a bus 24 to communicate with interface devices 26 and a memory 28. The interface devices 26 include input devices, such as a keyboard, mouse, etc. and output devices, such as a computer monitor, printer, etc. As indicated in FIG. 1, program instructions are received as input at the interface device module 26 and a circuit specification is delivered as output. The general operation of a CPU 22, bus 24, interface devices 26, and memory 28 is known in the art. The present invention is directed toward the executable program instructions stored in memory 28.

Memory 28 stores a dependency graph generator 30. As its name implies, the dependency graph generator generates a dependency graph for a set of program instructions. The dependency graph 32 is then stored in the memory 28. Typically, the dependency graph 32 is stored as a data structure with pointers between related instructions.

A scheduler 34 is used to schedule the sequence of steps required to execute the program instructions specified in the dependency graph. The required number of sequence steps results in a cycle number. To obtain performance results for the dependency graph, and in particular a parallelism value for the dependency graph, the cycle number is divided into the total number of instructions specified in the dependency graph. The performance results 36 may be stored in memory 28.

The instructions and data associated with modules 30, 32, 34, and 36 have been used in the prior art. The present invention is directed toward supplementing this prior art approach by inserting artificial dependencies into the dependency graph. This operation is performed by an artificial dependency generator 38, which produces a dependency graph with artificial dependencies 40.

The term artificial dependency refers to hardware limitations of a circuit, such as register renaming limitations, branch prediction limitations, and memory disambiguation limitations. Artificial dependencies limit the sequence in which a set of instructions can be processed. Thus, different artificial dependencies result in different circuit performance. For example, a circuit with a sophisticated register renaming scheme, branch prediction scheme, and memory disambiguation scheme will operate more efficiently than a circuit with a rudimentary register renaming scheme, branch prediction scheme, and memory disambiguation scheme. The present invention uses artificial dependencies in a dependency graph to assess circuit performance. A dependency graph with selected artificial hardware dependencies inserted therein effectively specifies a circuit with a specific set of parameters. Thus, by testing different artificial hardware dependencies in the dependency graph, different circuit designs are tested.

Selected combinations of artificial dependencies from the dependency graph with artificial dependencies 40 are applied to the scheduler 34. The scheduler 34 then generates a set of performance results 36 for the selected combinations of artificial hardware dependencies. These performance results 36 are then ranked by a ranking module 42. The ranking module 42 considers the performance gain, typically measured in reduced cycle time, for each selected combination of artificial dependencies. Preferably, the ranking module 42 further balances this performance gain versus at least one predetermined constraint. This balancing operation may be implemented with any known cost-benefit analysis technique. The predetermined constraints may include such factors as die size, power dissipation, and design time. For example, a numerically large performance gain for a specified circuit may be offset by a large die size and lengthy design time associated with the circuit. In this case, the cost-benefit of the circuit will result in a low overall performance value.

The circuit selection module 44 selects a top-ranked performance value. This operation effectively selects a top-ranked modified dependency graph configuration with selected artificial hardware dependencies. The circuit selection module 44 associates this top-ranked modified dependency graph with a corresponding circuit specification that can be used in constructing a circuit. That is, the selected artificial hardware dependencies of the top-ranked modified dependency graph are used to specify a circuit. The specified circuit has a set of characteristics, such as register renaming capabilities, branch prediction capabilities, and memory disambiguation capabilities. These characteristics may be specified in a known hardware description language such as HDL or VHDL, which is subsequently synthesized to form a netlist. The netlist may then be processed by a place and route tool to form a circuit layout. The circuit layout may then be used to fabricate a circuit with the features specified by the selected artificial hardware dependencies of the top-ranked modified dependency graph.

Figure 2:
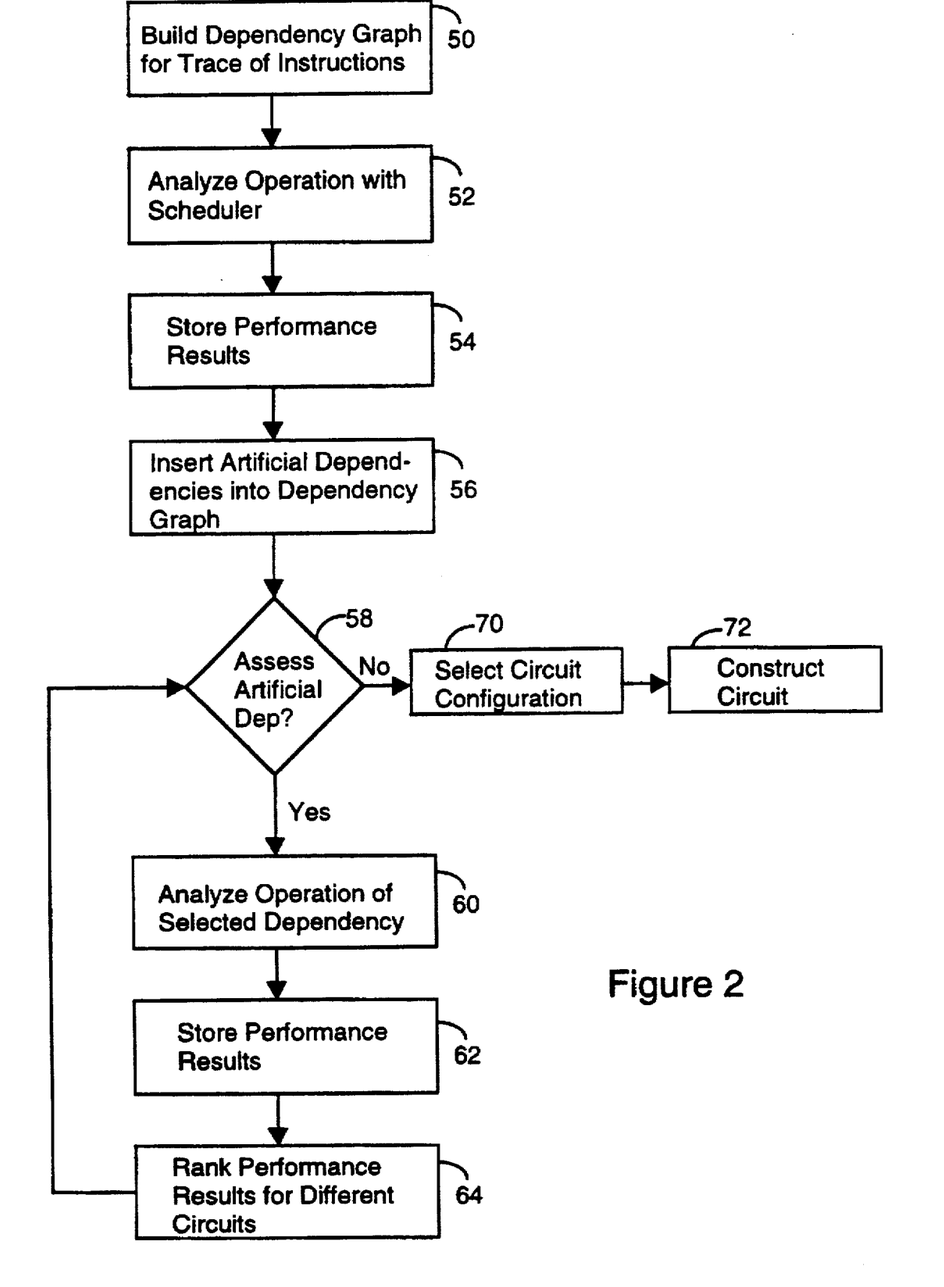
FIG. 2 illustrates processing steps associated with one embodiment of the invention.

The operation of the apparatus of FIG. 1 is more fully appreciated with reference to FIG. 2. FIG. 2 illustrates the processing steps executed by the apparatus of FIG. 1. The first step in the process is to build a dependency graph for a trace of instructions (step 50). This step is performed by the dependency graph generator 30. As indicated above, the process of taking a trace of instructions and generating a dependency graph is known in the art.

The next processing step of FIG. 2 is to analyze the operation of the dependency graph with a scheduler (step 52). This results in a set of performance results 36, which are stored in memory 28 (step 54). The analysis of a standard dependency graph (step 52) and the storing of the resultant performance results (step 54) are operations that have been performed in the prior art.

The present invention departs from the prior art by inserting artificial dependencies into the dependency graph (step 56). Thereafter, selected combinations of dependencies are assessed (step 58). In particular, step 58 is implemented as a set of control instructions to specify different combinations of artificial dependencies in the generated dependency graph with artificial dependencies 40. If a selected combination of artificial dependencies has not been assessed, then the selected combination of artificial dependencies is analyzed with a scheduler 34 (step 60). This results in a set of performance results 36, which are stored (step 62) in memory 28.

The performance results from the original dependency graph 32 are ranked, by the performance ranking module 42, in relation to the performance results generated for each combination of artificial dependencies analyzed (step 64). Afterwards, a decision is made to determine whether all of the artificial dependency combinations have been tested (step 58). If so, the processing of steps 60–62 is completed and a circuit configuration is selected (step 70) by the circuit selection module 44. As indicated above, the circuit selection module typically selects the top-ranked modified dependency graph configuration.

The selected circuit configuration is then used to construct a circuit (step 72). As indicated above, this step involves the transformation of the selected circuit configuration into a suitable hardware description language, which is subsequently synthesized into a netlist. The netlist is then placed and routed to form a circuit layout for fabrication.

The apparatus of FIG. 1 and the method of FIG. 2 is more fully appreciated with reference to a specific example. The following is a trace of hypothetical instructions that may be processed in accordance with the invention:

(1) ST R5, [R0+0XF4]
(2) LD [R0+0XC], R1
(3) ADD R0, R1, R2
(4) ORCC R2, 0XF, G0
(5) BGE DEST1
(6) ADD R1, R0, R2
(7) SUBCC R1, R0, R1
(8) BEQ DEST 2

Figure 3:
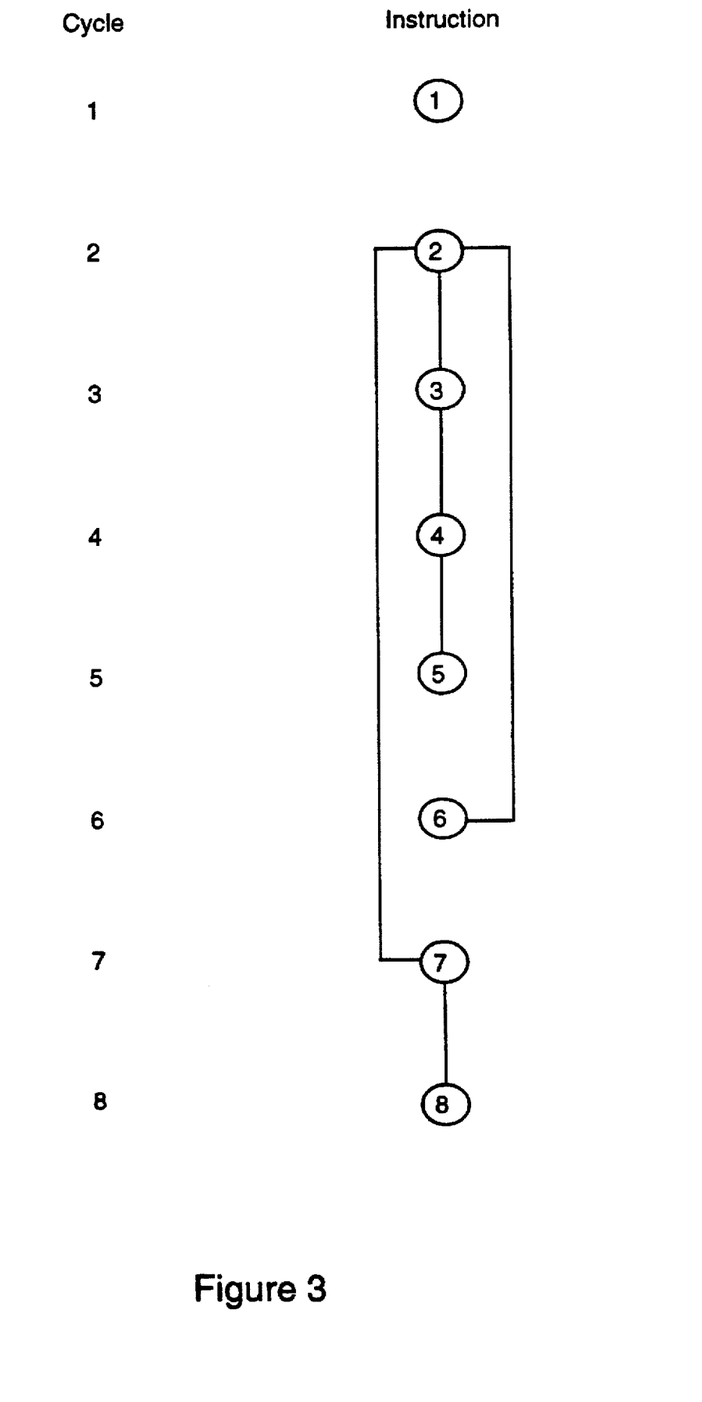
FIG. 3 illustrates a dynamic dependency graph associated with a set of program instructions.

FIG. 3 illustrates a dependency graph associated with this trace of instructions. The left side of FIG. 3 provides a cycle count, while the right side of the figure illustrates each instruction, shown as a circled number, being executed during a given cycle. The solid lines between instructions indicate true dependencies between instructions. True dependencies between instructions force a specific order on the execution of operations. For example, a true dependency exists between instructions (2) and (3), since instruction (2) must load the contents of the address space "R0+0XC" into register R1 before R1 is used in an ADD operation at instruction (3). Similarly, the value R1 must be established at instruction (2) before being used at instructions (6) and (7).

A real dependency also exists between instructions (3) and (4). An ADD operation at step (3) results in the loading of a value into the R2 register. This value is then used at step (4). Specifically, step (4) specifies an "OR Condition Code (ORCC)" statement. This statement results in the value in R2 being logically "ORed" with the hexadecimal constant "F" (the "OX" term indicates a hexadecimal value). The result of this OR operation is used to specify condition codes, such as overflow, equal, less than, greater than, or carry. The "G0" term at instruction (4) is a reference to a non-existent register, thus the result generated by the logical OR operation is not stored. However, the condition codes are used at step (5) for branch selection. That is, if the result of the logical OR operation at step 4 results in a greater than or equal (BGE) condition code, then a branch is made to a first destination (DEST1). Thus, there is a true dependency between instructions (4) and (5), as shown in FIG. 3.

There is a similar dependency between instructions (7) and (8). At instruction (7), the contents of register R1 are subtracted from the contents of register R0 and the resultant condition codes are stored in register R1. The resultant condition codes are also used at instruction (8). That is, if the condition codes result in an equivalent condition (BEQ), then a branch is made to a second destination (DEST2).

Figure 4:
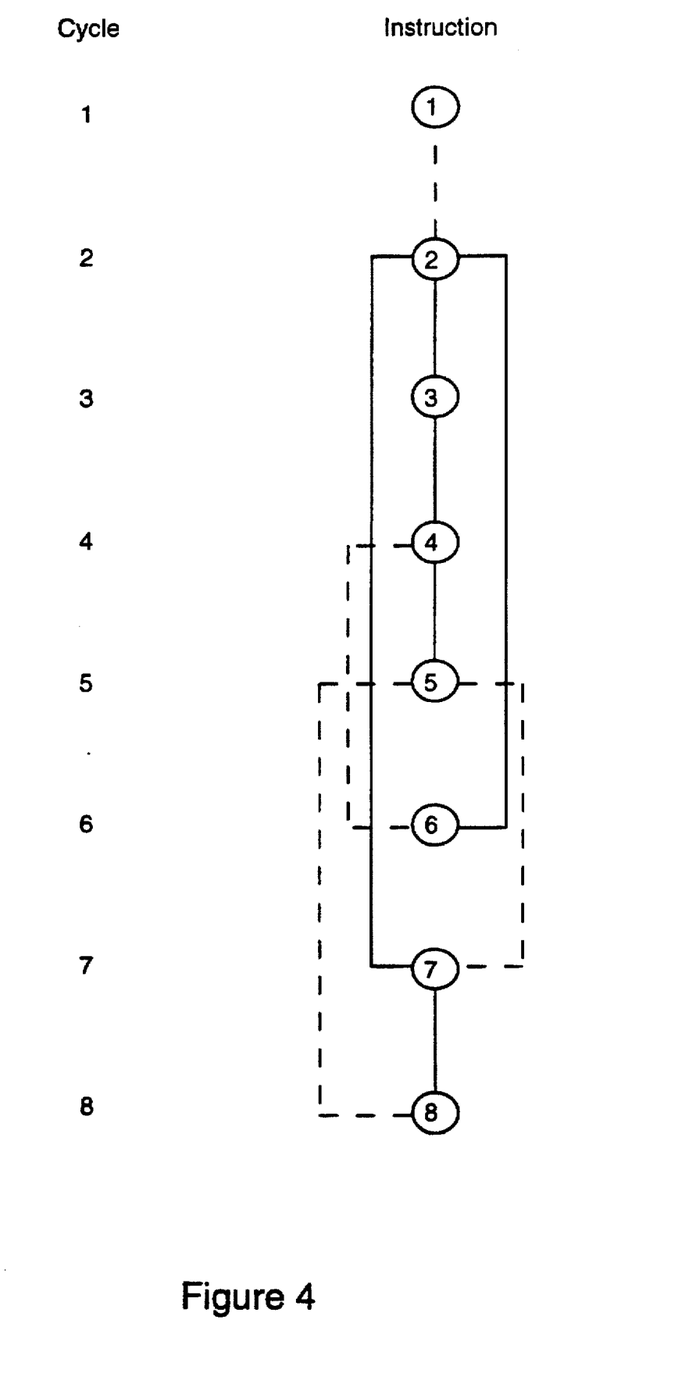
FIG. 4 illustrates a dynamic dependency graph with artificial hardware dependencies inserted therein.

Techniques to generate a dependency graph, as shown in FIG. 3, from a set of instruction traces are known in the art. These techniques may be incorporated into a dependency graph generator 30, as previously discussed. The present invention uses an artificial dependency generator 38 to insert artificial dependencies into a dependency graph, thereby producing a dependency graph with artificial dependencies. FIG. 4 illustrates a dependency graph with artificial dependencies.

In accordance with the invention, an artificial dependency, as indicated by a dashed line, is inserted between instructions (1) and (2). An artificial dependency exists in this case because the hardware limitations of the circuit executing the operation will determine whether the two instructions can be executed in parallel. The ability to execute these instructions in parallel is contingent upon the memory disambiguation characteristics of the circuit. Many circuits do not include memory disambiguation resolution to distinguish between the address "R0+0XF4" of instruction (1) and the address "R0+0XC" of instruction (2). That is, the hardware may only be able to recognize at instruction (1) that the contents of register R5 are being stored at a memory address specified by register R0 plus a hexadecimal value (as specified by "0X"). The hardware may not be able to distinguish between specified hexadecimal values. Thus, at instruction (2), the hardware may have to operate on the assumption that the same address space is being accessed. In reality, two separate address spaces are being accessed, since instruction (1) specifies an address of register R0 plus the hexadecimal value F4 and instruction (2) specifies an address of register R0 plus the hexadecimal value C. If the hardware is unable to distinguish these addresses, then the hardware will be constrained to processes these instructions sequentially. That is, the hardware must operate on the assumption that the address specified at instruction (1) is the same as the address specified at instruction (2). Consequently, the loading step of instruction (2) cannot be performed until the storing step of instruction (1) is completed.

Figure 5:
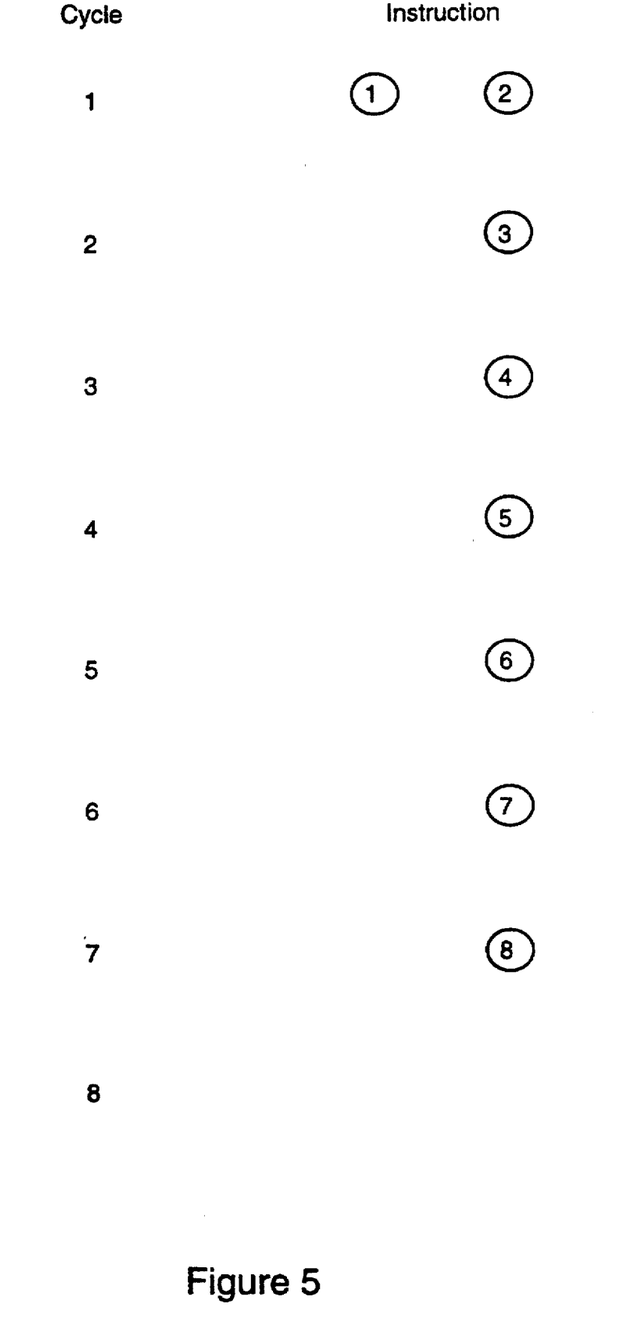
FIG. 5 illustrates an improvement in processing of the set of program instructions associated with FIG. 3 when a selected artificial hardware dependency of improved memory disambiguation is used.

The present invention transforms a standard dependency graph into a dependency graph with artificial dependencies. Each artificial dependency can then be analyzed with different hardware assumptions. Each hardware assumption will generate a separate performance result 36. For example, the artificial dependency between instructions (1) and (2) can be analyzed with an assumption that there is poor memory disambiguation hardware and therefore, the instructions must be executed sequentially. In addition, the same artificial dependency may then be analyzed with an assumption that there is strong memory disambiguation circuitry that can distinguish the separately specified addresses of instructions (1) and (2). If this is the case, then instructions (1) and (2) can be performed in parallel, as shown in FIG. 5. By performing these steps in parallel, the sequence of instructions can be performed in seven cycles, as shown in FIG. 5, instead of eight cycles, as shown in FIG. 4. Thus, the performance result for a circuit with strong memory disambiguation will be better than the performance result for a circuit with weak memory disambiguation. However, as indicated above, this performance result may be further assessed by the performance ranking module 42 with a cost-benefit analysis. A cost-benefit analysis executed by the performance ranking module 42 may determine that the increase in performance by one cycle does not justify the additional die space and design time required to implement a circuit with strong memory disambiguation features. In such a case, a low performance value would be assigned.

FIG. 4 also illustrates an artificial hardware dependency existing between instructions (4) and (6). Instruction (4) uses the value in register R2 to generate a condition code.

Figure 6:
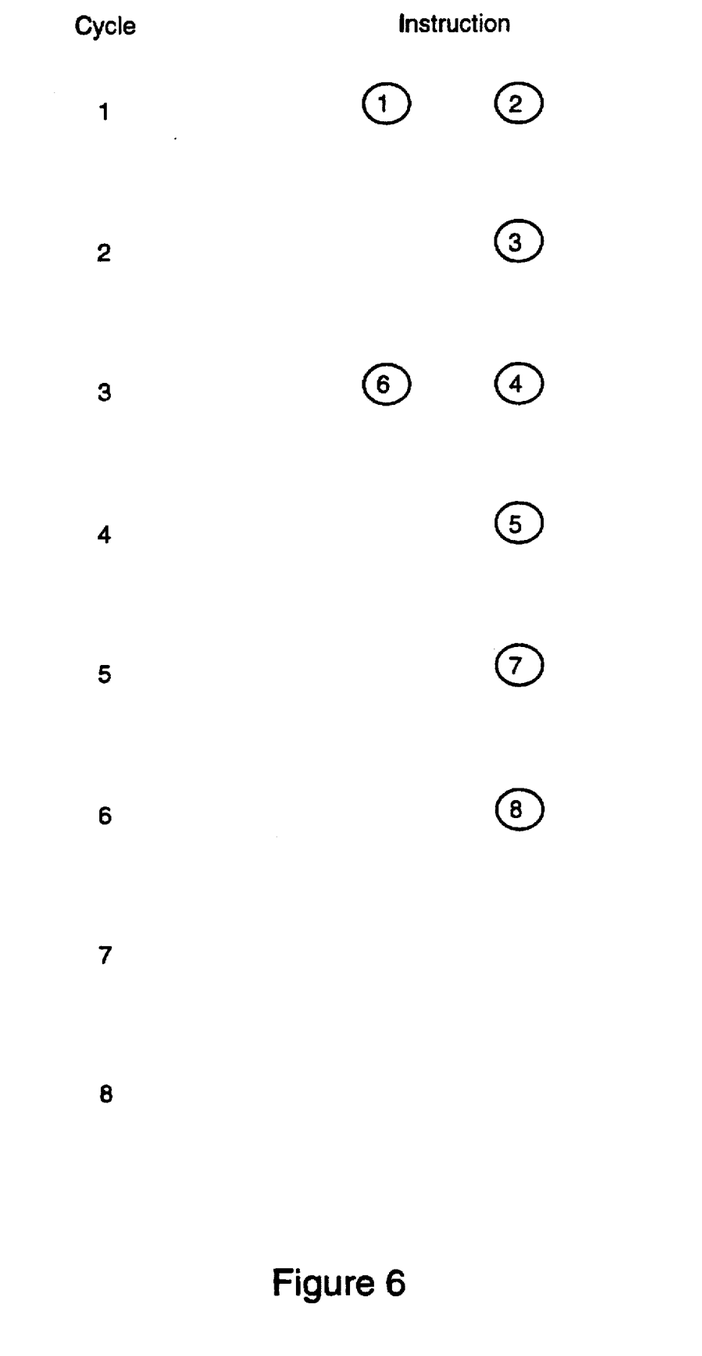
FIG. 6 illustrates an improvement in processing of the set of program instructions associated with FIG. 3 when a selected artificial hardware dependency of improved register renaming is used.

Instruction (6) adds two register values to obtain a new value in register R2. If instruction (6) is executed before instruction (4), then the condition code generated at instruction (4) may be erroneous. However, this problem can be avoided if the circuit processing the instructions is capable of recognizing that register R2 at instruction (6) can be renamed. Circuits are implemented with different register renaming capabilities. Thus, in accordance with the invention, a register renaming artificial dependency exists between instructions (4) and (6). This artificial dependency is processed by analyzing the operation of a circuit configuration that is capable of renaming register R2 at instruction (6). As shown in FIG. 6, if such a configuration is relied upon, instructions (4) and (6) can be processed in the same cycle. Thus, a processing improvement of a single cycle may be obtained. As indicated in FIG. 2, this performance result is stored (step 62). Further, the cost-benefit of this performance result may be analyzed by the performance ranking module 42, resulting in a new set of ranked performance results (step 64).

Figure 7:
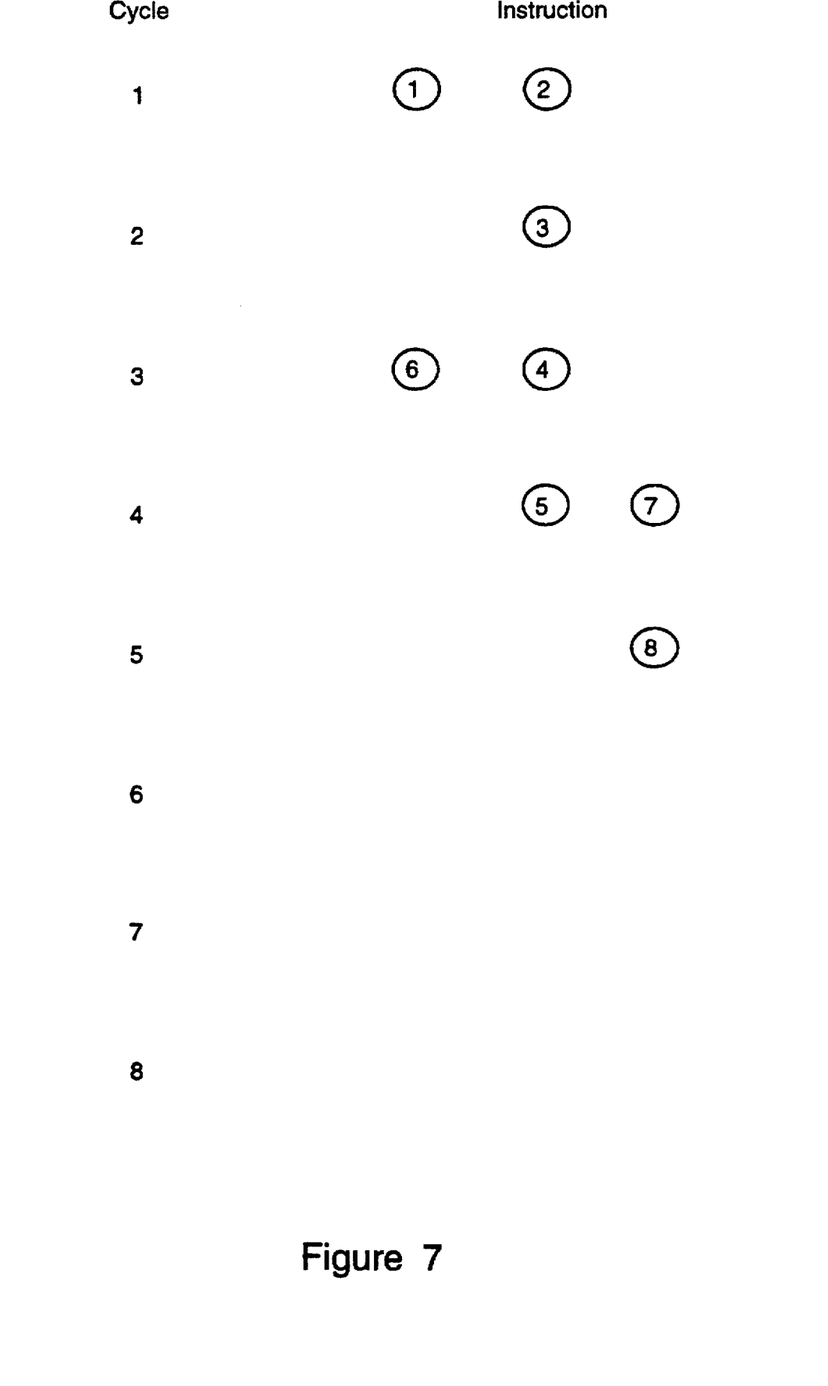
FIG. 7 illustrates an improvement in processing of the set of program instructions associated with FIG. 3 when a selected artificial hardware dependency of improved condition code processing is used.

Returning to FIG. 4, it can be seen that an artificial dependency has been inserted between instructions (5) and (7). Instruction (5) relies upon the condition codes generated at instruction (4). Instruction (7) generates a separate set of condition codes. Some circuits are restricted to a single set of condition codes during a given cycle, thus a hardware dependency is said to exist between these instructions. In accordance with the invention, different assumptions may be made regarding the capability of the circuit to handle condition codes. For example, an artificial dependency may be assumed wherein a circuit can handle two sets of condition codes during the same cycle. As a result, instructions (5) and (7) can be processed in the same cycle, as shown in FIG. 7. FIG. 7 illustrates that this results in a performance improvement of one cycle. As indicated above, this performance improvement is subsequently subjected to a cost-benefit analysis executed by the performance ranking module 42. This results in a new set of ranked performance results 36.

Figure 8:
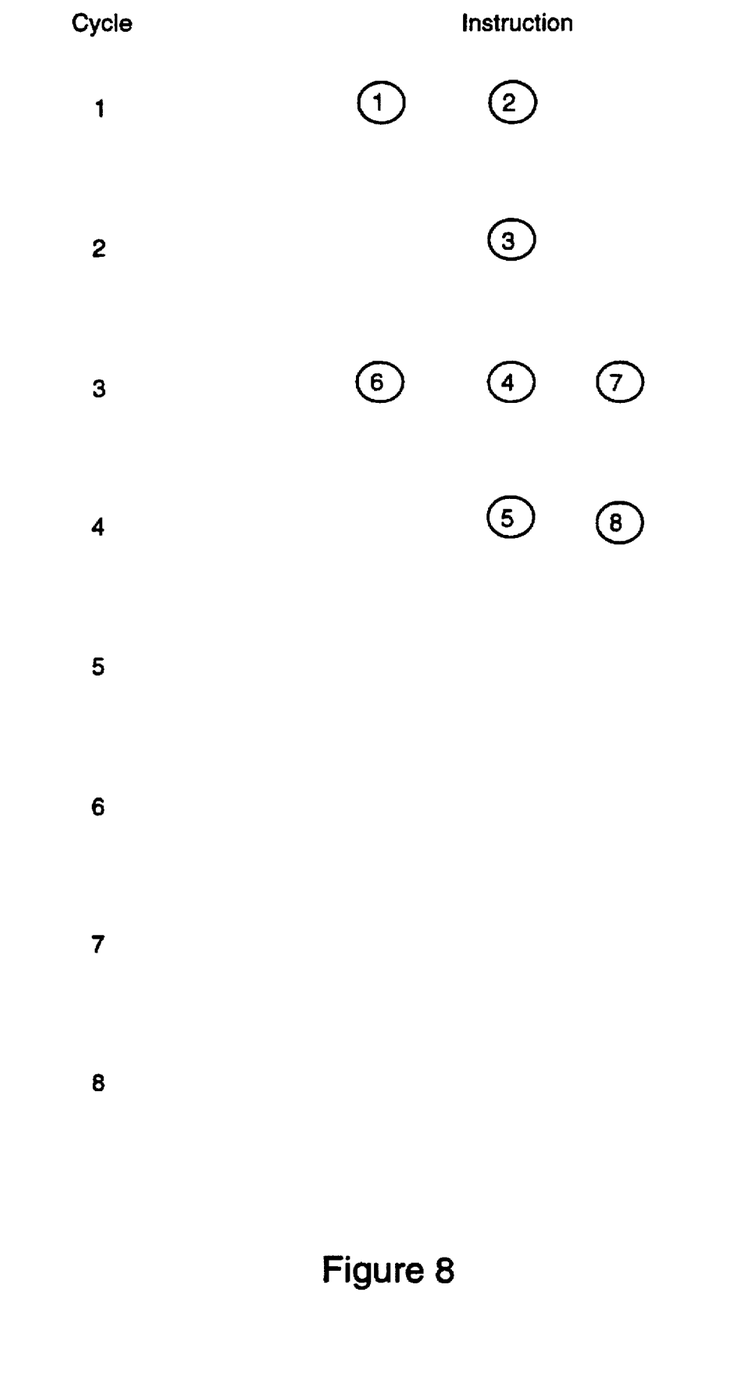
FIG. 8 illustrates an improvement in processing of the set of program instructions associated with FIG. 3 when a selected artificial hardware dependency of improved branch handling is used.

Returning to FIG. 4, it can be observed that a final artificial hardware dependency exists between instructions (5) and (8). Both instructions are branch instructions. Circuits generally have limitations regarding branch sequences. However, these limitations can be overcome with appropriate design features. Thus, in accordance with the invention, an artificial hardware dependency is said to exist between instructions (5) and (8). This artificial hardware dependency is then analyzed under one or more assumptions. For example, an assumption can be made that the circuit is capable of fully handling simultaneous branches during a single cycle. The processing sequence and performance results for this selected artificial dependency are shown in FIG. 8. As shown in the figure, this selected artificial dependency results in a performance improvement of one cycle. This performance improvement may be subject to a cost-benefit analysis executed by the performance ranking module 42. Since the additional die size and design time required to implement a capability for simultaneous branching would be prohibitive, the cost-benefit analysis of this feature would probably remit in a relatively low performance value ranking.

Note in FIG. 8 that the total performance improvement stemming from improved memory disambiguation, register renaming, condition code processing, and branch handling renders a savings of four cycles (a parallelism value of 2, instead of the parallelism value of 1 in FIG. 3). However, as indicated above, this cycle improvement is preferably balanced against other cost-benefit considerations. FIG. 8 illustrates a scenario wherein all of the hardware dependencies are simultaneously analyzed. It should be appreciated that different combinations of hardware dependencies are analyzed in accordance with the invention. For example, the hardware dependency between instructions (1) and (2) may be analyzed in combination with the hardware dependency between instructions (5) and (7). It should be further appreciated that different assumptions may be made for each hardware dependency. For example, in the case of memory disambiguation, the ability to identify addressed locations may be tested at four levels of accuracy. In this case, as the memory disambiguation accuracy increases, resulting in potential gains in cycle performance, the complexity of the implementing circuit will also increase, which might result in a relatively low overall performance ranking.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A method of improving the design of a circuit, said method comprising the steps of:

building a dependency graph for a set of instructions to be executed by said circuit;

inserting a set of artificial dependencies into said dependency graph to form a modified dependency graph corresponding to a modified circuit, said set of artificial dependencies corresponding to hardware dependencies specifying circuit limitations of said modified circuit;

analyzing the execution performance of selected artificial dependencies of said modified dependency graph to generate a set of performance results; and selecting a final circuit configuration based upon said performance results.

2. The method of claim 1 wherein said selecting step includes the step of ranking said performance results in view of a selected criteria.

3. The method of claim 2 wherein said selected criteria of said ranking step includes balancing a performance gain versus a predetermined constraint.

4. The method of claim 3 wherein said predetermined constraint of said ranking step is selected from the group including die size, power dissipation, and design time.

5. The method of claim 1 wherein said circuit limitations include register renaming limitations, branch prediction limitations, and memory disambiguation limitations.

6. The method of claim 1 wherein said analyzing step includes the step of analyzing multiple configurations for a selected artificial dependency of said selected artificial dependencies.

7. The method of claim 1 further comprising the step of constructing a circuit based upon said final circuit configuration.

8. A method executed by a computer under the control of a program, said computer including a memory for storing said program, said method comprising the steps of:

building a dependency graph for a set of instructions to be executed by a circuit;

inserting a set of artificial dependencies into said dependency graph to form a modified dependency graph corresponding to a modified circuit, said set of artificial dependencies corresponding to hardware dependencies specifying circuit limitations of said modified circuit;

analyzing the execution performance of selected artificial dependencies of said modified dependency graph to generate a set of performance results; and selecting, based upon said performance results, a final circuit configuration corresponding to selected artificial dependencies of said modified dependency graph.

9. The method of claim 8 wherein said selecting step includes the step of ranking said performance results in view of a selected criteria.

10. The method of claim 9 wherein said selected criteria of said ranking step includes balancing a performance gain versus a predetermined constraint.

11. The method of claim 10 wherein said predetermined constraint of said ranking step is selected from the group including die size, power dissipation, and design time.

12. The method of claim 8 further comprising the step of constructing a circuit based upon said final circuit configuration.

13. The method of claim 8 wherein said circuit limitations of said inserting step include register renaming limitations, branch prediction limitations, and memory disambiguation limitations.

14. A computer readable memory that can be used to direct a computer to function in a specified manner, comprising:

executable instructions stored in said memory, said executable instructions including:

(A) instructions to build a dependency graph for a set of computer program statements to be executed by a circuit;

(B) instructions to insert a set of artificial dependencies into said dependency graph to form a modified dependency graph corresponding to a modified circuit, said set of artificial dependencies corresponding to hardware dependencies specifying circuit limitations of said modified circuit;

(C) instructions to analyze the execution performance of selected artificial dependencies of said modified dependency graph to generate a set of performance results;

(D) instructions to rank said performance results in view of selected criteria and thereby identify a top-ranked modified dependency graph configuration; and (E) instructions to coordinate said top-ranked modified dependency graph configuration with a corresponding final circuit specification for use in constructing a circuit.

15. The computer readable memory of claim 14 wherein the instructions of element (D) rank said performance results by balancing a performance gain versus a predetermined constraint selected from the group including die size, power dissipation, and design time.

16. An apparatus for designing a circuit, said apparatus comprising:

a dependency graph generator to build a dependency graph for a set of instructions to be executed by a circuit;

an artificial dependency generator to insert a set of artificial dependencies into said dependency graph to form a modified dependency graph corresponding to a modified circuit, said set of artificial dependencies corresponding to hardware dependencies specifying circuit limitations of said modified circuit;

a scheduler to analyze the execution performance of selected artificial dependencies of said modified dependency graph to generate a set of performance results; and a circuit selection module to select a final circuit specification based upon said performance results.

17. The apparatus of claim 16 further comprising a performance ranking module to rank said performance results in view of a selected criteria and thereby identify a top-ranked modified dependency graph configuration, said circuit selection module relying upon said top-ranked modified dependency graph configuration to select said circuit specification.

18. The apparatus of claim 17 wherein said dependency graph generator, said artificial dependency generator, said scheduler, said circuit selection module, and said performance ranking module are implemented as software modules running on a general purpose computer.

* * * * *